Figure 1:
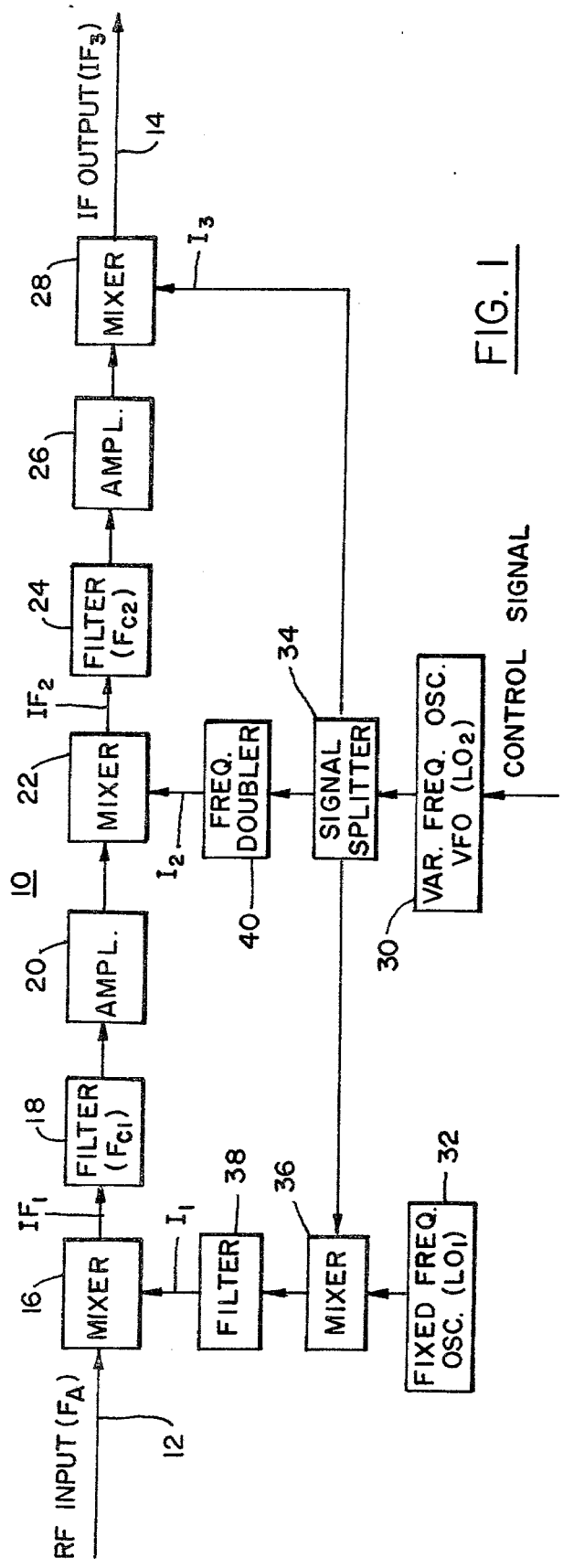

United States Patent [19]

Hauer

[11] 4,262,361
[45] Apr. 14, 1981

[54] VARIABLE BANDWIDTH FILTERING AND FREQUENCY CONVERTING SYSTEM

[75] Inventor: Frederick W. Hauer, Clifton Springs, N.Y.

[73] Assignee: EDMAC Associates, Inc., East Rochester, N.Y.

[21] Appl. No.: 53,615

[22] Filed: Jun. 29, 1979

[51] Int. Cl.³ .......................... H04B 1/04; H04B 1/26
[52] U.S. Cl. .................................. 455/113; 455/118; 455/207; 455/266; 455/315
[58] Field of Search ................ 455/22, 110, 112, 113, 455/118, 119, 207, 266, 313, 314, 315, 318, 319

[56] References Cited

U.S. PATENT DOCUMENTS

| | | | |
|---|---|---|---|
| 2,407,212 | 9/1946 | Tunick | 325/11 |
| 2,606,285 | 8/1952 | Bataille et al. | 325/433 |
| 2,692,332 | 10/1954 | Godbey | 325/435 |
| 2,747,084 | 5/1956 | Doelz | 325/432 |
| 2,998,517 | 8/1961 | Beckerich | 325/432 |
| 3,008,043 | 11/1961 | Caulk | 325/433 |

Primary Examiner—Jin F. Ng
Attorney, Agent, or Firm—Martin LuKacher

[57] ABSTRACT

A system which provides frequency conversion and continuously variable bandwidth control uses fixed filters to which opposite edges of the passband of the signal are applied in inverted frequency relationship. A channel contains the filters and three mixers to which injection signals derived from a single variable frequency oscillator and a fixed oscillator are applied to vary the bandwidth of the system without affecting the center frequency of the signal after processing in the system. The system may be designed to obtain either a variable bandpass or rejection band filtering characteristic.

8 Claims, 3 Drawing Figures

VARIABLE BANDWIDTH FILTERING AND FREQUENCY CONVERTING SYSTEM

DESCRIPTION

The present invention relates to systems for providing variable bandwidth characteristics in the processing of high frequency signals such as radio signals, and particularly to systems for frequency conversion of radio signals suitable for use in receivers and transmitters and other electrical signal processing apparatus which provides variable bandwidth characteristics which may be either a variable bandpass or band rejection characteristic.

The invention is especially suitable for use in radio receivers in that it enables the bandwidth about the frequency to which the receiver is tuned to be varied without affecting that frequency. The frequency to which the radio is tuned is referred to as the center frequency. The invention is also useful in other signal processing applications, such as in single sideband transmission for providing a variable rejection or notch width to filter out or attenuate the carrier frequency and selected portions of the side bands. Other uses of the invention are to control transmitter bandwidth in FM transmission in accordance with modulating frequency to improve the signal to noise characteristics of an FM transmission.

It has been proposed to vary the bandpass characteristic of a radio receiver by using a fixed filter and varying the frequency of the IF signal across the passband of the fixed filter by mixing it with a variable local oscillator frequency (see the Instruction Manual for the FT-101ZD HF Transceiver, manufactured by Yaesu Musen Co., Ltd., of Japan). By providing another filter, mixer and variable local oscillator, the signal may be inverted (the frequency spectrum reversed) and the frequency thereof varied across the passband of another filter. In this manner, both the upper and lower edges of the passband may be varied to vary the bandwidth of the signal. The use of two sets of filters, mixers and local oscillators is described in Electronics Magazine for Feb. 20, 1975 on Pages 90 and 91. The proposed systems require two mixers on opposite sides of each filter so that the frequency of the signal being processed is returned to the same frequency. Additional mixers are required in order to convert the frequency of the signal between RF and IF frequencies. Thus, additional components, particularly one or more additional variable frequency oscillators and mixers, than are otherwise required in the radio are necessary in order to obtain the variable bandpass characteristics. The additional mixers also contribute to the possibility of unwanted spurious responses. In addition, the frequency instability of the variable local oscillators affects the tuning of the receiver and the center frequency to which the radio is tuned may differ from the indicated frequency as shown on the tuning dial or other tuning indicator of the radio. The additional variable local oscillators and mixers also result in circuit complexity and increased cost.

Other systems for frequency conversion have made use of inversion of the frequency relationship of the signal being processed, but have not been applied in order to obtain a variable bandwidth filtering characteristic (see Wojciechowski, U.S. Pat. No. 2,996,684; Wohlenberg et al, U.S. Pat. No. 3,119,067; Bourget, U.S. Pat. No. 3,525,046; and Muzzi, U.S. Pat. No. 3,628,155). Variable frequency oscillators have also been used, but not for the purpose of frequency conversion in a manner to obtain variable bandwidth characteristics (see Guanella, U.S. Pat. No. 2,505,043; Kolster, U.S. Pat. No. 2,534,606; Robinson, U.S. Pat. No. 3,204,185; Schneider, U.S. Pat. No. 3,324,396; Honore U.S. Pat. No. 3,878,476; and Shiki, U.S. Pat. No. 3,942,118).

Accordingly, it is an object of the present invention to provide an improved frequency conversion system having variable bandwidth characteristics. By bandwidth is meant either the width of the band passed or of the band rejected by the system. The band rejected may also be considered as the width of the notch in the signal spectrum which is passed by the system or simply the notch width of the filter.

It is a further object of the present invention to provide an improved variable bandwidth frequency conversion system which may be controlled simply by means of only one variable frequency oscillator.

It is a still further object of the present invention to provide an improved variable bandwidth frequency conversion system which has a high degree of frequency stability without requiring special frequency or phase control means, such as phase locked loops, to obtain frequency stability.

It is a still further object of the present invention to provide an improved variable bandwidth frequency conversion system having a continuously variable bandwidth rather than step changes in band width, and which may be used in a radio (either a receiver, transmitter or transceiver) without affecting the center frequency to which the radio is tuned.

It is a still further object of the present invention to provide an improved frequency conversion system having continuously variable bandwidth which operates with or provides IF signals having a fixed IF center frequency while providing variable bandwidth control of the signals which are processed by the system.

It is a still further object of the present invention to provide an improved frequency conversion system that can be integrated into a dual conversion receiver and which operates with either high or low side injections to provide continuously variable bandwidth control across a passband or rejection notch having a constant center frequency.

It is a still further object of the invention to provide an improved frequency conversion system which provides continuously variable bandpass characteristics in which the possibility of spurious responses is reduced by reducing the required number of mixer stages (e.g., using three rather than four mixers in the signal path).

It is a still further object of the present invention to provide an improved IF strip for a multiple conversion radio which provides continuously variable bandwidth characteristics.

It is a still further object of the present invention to provide an improved variable band rejection filtering system applicable to FM or sideband transmitters to reduce the level of the carrier frequency signal in the transmission.

It is a still further object of the present invention to provide an improved variable rejection band filtering system which is applicable to AM transmitters to provide amplitude modulation by varying the notch width as a function of a modulating signal (viz., as a function of the frequency and amplitude of the modulating signal).

Briefly described, a system embodying the invention provides for variable bandwidth filtering (either a change in the bandpass or band rejection characteristics of the system) in a continuous and stepless manner while converting the frequency of the signal between first and second frequencies. These first and second frequencies are, in a preferred embodiment of the invention, RF and IF frequencies. The IF frequency is constant when the invention is embodied in a radio receiver, and the RF frequency is the frequency to which the receiver is tuned. The system has a channel for transmission of the signal in which the frequency thereof is converted. The first and second frequencies are the frequencies of the signal at the opposite ends of the channel and these ends may be referred to as the first or RF frequency and the second or IF frequency end of the channel. The channel contains first and second filter networks having first and second cutoff frequencies. These filters may be low pass filters or high pass filters depending upon the frequency conversions which take place in the channel before and after the filters. In the preferred embodiment of the invention the filters have bandpass characteristics with the passband of the filter extending from the cutoff frequency of the filter toward decreasing frequencies and being of sufficient width to include the passband of the signal being processed in the channel. Low pass filters may be used. However, bandpass filters are preferred when the system is used in radio applications to eliminate out-of-band spurious frequencies. The filter network should provide attenuation above the filter cutoff frequency so that a rectangular bandpass or band rejection (notch) characteristic can be achieved by the system.

The frequency converting means in the channel includes a plurality of mixers. No more than three mixers are required. Two of these mixers present the pass band of the signal in inverted frequency relationship (with its frequency spectrum reversed) to one of the filter networks and in direct or noninverted frequency relationship to the other filter. To provide for the frequency conversion, a single continuously variable frequency oscillator is used. A fixed frequency oscillator may also be used. The frequency to which this variable frequency oscillator is tuned determines the bandwidth of the system. Injection signals to all of the mixers are derived from the variable frequency oscillator and applied to the mixers such that the frequency of the variable frequency oscillator signal determines only the bandwidth of the system and does not affect the frequency either at the RF or IF end of the channel. The output frequency of the system, whether it be the IF frequency in a a receiver application or the RF frequency in a transmitter application, is determined solely by the frequency of the fixed frequency oscillator. The stability of the variable frequency oscillator thus does not affect the tuning of a radio embodying the system.

Figure 3:
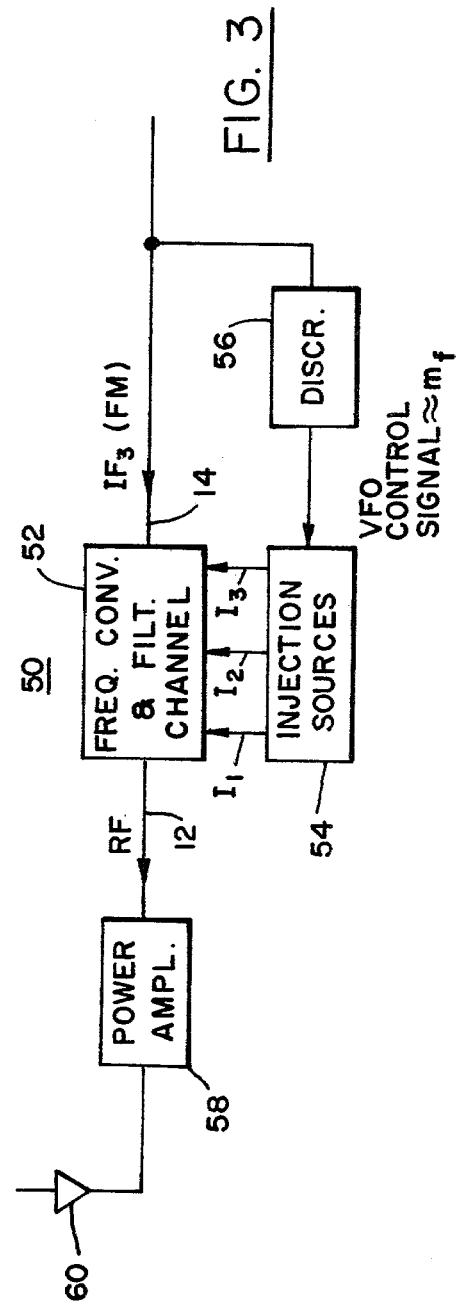
Figure 2:
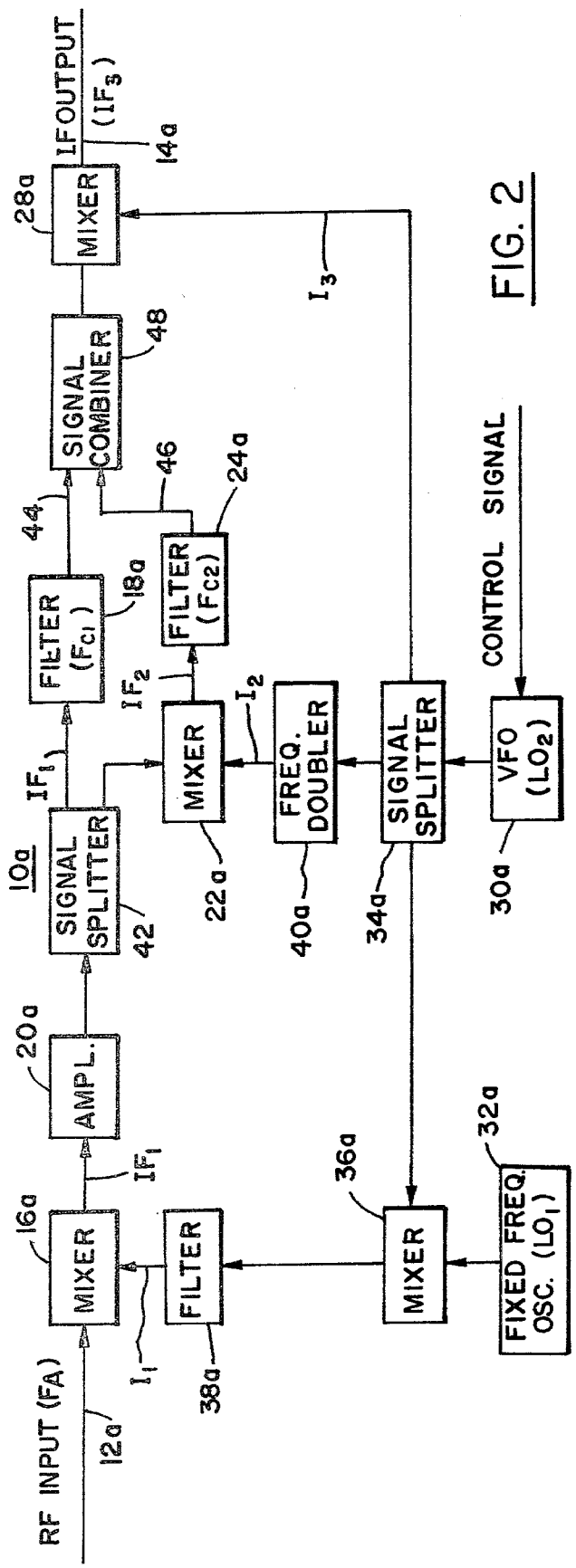

The foregoing and other features, objects and advantages of the invention as well as presently preferred embodiments thereof will become more apparent from a reading of the following detailed description in connection with the accompanying drawings in which FIG. 1 is a block diagram showing a system for converting the frequency of an RF input signal to an IF output while providing triple frequency conversion with variable bandpass characteristics and is especially adapted for use in a radio receiver;

FIG. 2 is a block diagram showing a system embodying the invention which provides a variable band rejection or notch width characteristic as well as frequency conversion; and FIG. 3 is a simplified block diagram showing a FM transmitter utilizing a system for frequency conversion and bandwidth control such as illustrated in FIG. 1 to control the spectral characteristics of the transmission in accordance with the FM modulation index of the frequency modulated signal to be transmitted.

Referring more particularly to FIG. 1 there is shown a transmission channel 10 having an RF input at one end 12 of the channel and an IF output at the opposite end 14 thereof. Should the system be used in a transmitter the IF end would provide the input signals while the output signal would be obtained from the RF end and applied to an antenna or other utilization device. The RF input which is the frequency at the RF end 12 of the channel is $F_A$. The IF output frequency is called $IF_3$. The channel has in series a first mixer 16 connected to the RF end 12 of the channel 10 and a filter 18 having a cutoff frequency $F_{CI}$. The cutoff frequency may be at the 3dB down point of the attenuation characteristic of the filter. $F_{CI}$ is the high frequency cutoff of the bandpass characteristic of the filter. The filter is preferably a bandpass filter which passes a band at least equal to the bandwidth of the RF input below the high frequency cutoff $F_{CI}$. The filter may be a lowpass filter. A bandpass filter is preferred in radio applications as explained above. The filter may, for example, be of Bessel type or it may be a surface acoustic wave (SAW) filter.

In series with the filter 18 is an amplifier 20. Another mixer 22 follows the amplifier 20. A second filter 24 having a cutoff frequency at the high end of its bandpass of $F_{C2}$ follows the mixer 22. The filter 24 may be of the same type as the filter 18, e.g., Bessel, SAW, etc. An amplifier 26 follows the filter 24. A third mixer 28 at the IF end of the channel 14 is connected to the output of the amplifier 26 and provides the IF output. The arrangement of mixers and filters in series in the channel 10 provides for a continuously variable bandpass characteristic for the system. When the filters are arranged in parallel branches of the channel as shown in FIG. 2, a variable band rejection characteristic is obtained. In other words the notch width of the spectrum passed by the system is variable. In both cases the filter bandwidth is adjustable and the term bandwidth is generic to either the width of the passband or the rejection band or notch.

The mixers 16, 22 and 28 in the channel provide means for converting the frequency of the signal transmitted between the first or RF input frequency $F_A$ and the second or IF output frequency $IF_3$ at the opposite ends of the channel. Included in the frequency conversion means are a variable frequency oscillator (VFO) 30 which provides the local oscillator signal of frequency $LO_2$. A fixed frequency oscillator 32 provides an output signal of frequency $LO_1$. A signal splitter 34, such as a transformer, splits the VFO output into three signals such that the VFO output is used to derive the injection frequency signals $I_1$, $I_2$, and $I_3$ to the mixers 16, 22, and 28 respectively. A first IF frequency $IF_1$ results from the mixing or heterodyning of the RF input with the injection $I_1$. The signal converted by the mixer 22 is the second IF frequency $IF_2$. To provide the injection $I_1$ the VFO signal from the splitter 30 is mixed with the signal from the oscillator 32 in a mixer 36. One of the side bands is selected by a filter 38 and provides the first injection $I_1$. The second injection is provided by a frequency doubler 40 which doubles the VFO output signal to a frequency $2LO_2$ which is the frequency of the second injection $I_2$. The third injection is obtained from the splitter and is of the same frequency $LO_2$ as the VFO output.

The first injection $I_1$ may either be higher of lower than the RF input frequency $F_A$. When low side injection is used, $LO_1$ is less than $F_A$. It is important that the frequency at the high frequency end 12 of the channel 10 be greater than the difference between the frequency of the fixed frequency oscillator 32 and the variable frequency oscillator 30. In other words $$F_A > LO_1 - LO_2 \quad (1)$$

Now when low side injection is used, the lower sideband mixer products are selected by the filter 38 from the output of the mixer 36. When high side injection $I_1$ is used, the fixed frequency oscillator output frequency $LO_1$ is greater than the frequency $F_A$ and the upper sideband of the products from the mixer 36 are selected by the filter 38. In all other respects the system of FIG. 1 operates the same whether high side or low side injection $I_1$ is used.

The RF input is converted to the first IF frequency $IF_1$ in the mixer 16 and filtered by the filter 18 which defines the high frequency cutoff of the overall variable bandpass characteristics of the system. The output of the filter 18 is amplified by the amplifier 20 and applied to the mixer 22 where it is mixed with twice the VFO frequency ($2LO_2$) from the doubler 40 and downconverted to the second IF frequency $IF_2$. This conversion inverts the passband and presents the passband of the signal which is being processed in inverted frequency relationship to the filter 24 from the frequency relationship (direct frequency relationship) in which the passband was presented to the filter 18. The filter 24 therefore defines the high frequency cutoff of the inverted passband and the low frequency cutoff of the overall bandpass characteristics of the system.

The amplifier 26 amplifies the output of the filter 24 and applies it to the mixer 28 where the passband thereof is re-inverted and converted to the IF output ($IF_3$). As the VFO frequency $LO_2$ is changed, the output frequency $IF_3$ remains centered at the same center frequency. The passband increases as the VFO frequency decreases at a rate that is twice the rate of change of the VFO output signal frequency. The output frequency $IF_3$ is completely independent of the frequency $LO_2$ of the VFO output signal and the numerical value of the output frequency is controlled solely by the frequency $LO_1$ of the fixed frequency oscillator 32. Any instability in the system which might be a function of the VFO 30 does not appear in the output. The fixed frequency oscillator 32 may be a very stable oscillator so that the stability of the system does not suffer by reason of the provision of variable bandpass characteristics. The frequency relationships which dictate that the bandpass characteristics of the system is dependent solely on the cutoff frequencies $F_{C1}$ and $F_{C2}$ of the filters 18 and 24, and the frequency $LO_2$ of the VFO 30 may be obtained from inspection of FIG. 1. These relationships are $$BW = F_{C1} - [F_A - (LO_1 - LO_2)] + F_{C2} - \{=\!\!\!\!\!=\! 2LO_2 - [F_A - (LO_1 - LO_2)]\} \quad (2)$$

$$BW = F_{C1} - 2LO_2 + F_{C2} \quad (3)$$

The output frequency $IF_3$ is dependent solely upon the frequency at the input end of the channel 10 ($F_A$) and on the frequency of the fixed frequency oscillator $LO_1$. From FIG. 1 it can be seen that these relationships apply $$IF_3 = LO_2 - \{2LO_2 - [F_A - (LO_1 - LO_2)]\} \quad (4)$$

$$IF_3 = F_A - LO_1 \quad (5)$$

The center frequency of the passband of the IF output, $IF_3$, is related to the cutoff frequencies of the filters 18 and 24 by $$IF_3 = (F_{C1} - F_{C2})/2 \quad (6)$$

For the case of high side first injection frequencies ($I_1 > F_A$) which was discussed above, similar relationships apply, namely $$BW = F_{C1} - [(LO_1 + LO_2) - F_A] + F_{C2} - \{2LO_2 - [(LO_1 + LO_2) - F_A]\} \quad (7)$$

$$BW = F_{C1} - 2LO_2 + F_{C2} \quad (8)$$

$$IF_3 = LO_2 - \{2LO_2 - [(LO_1 + LO_2) - F_A]\} \quad (9)$$

$$IF_3 = LO_1 - F_A \quad (10)$$

Table A presents by way of example, typical bandwidth variation of from 0.1 to 1 MHz for RF input signals of center frequency of 150 MHz. The first line of Table A is for the low side injection case, and the second line for the high side injection. The VFO output signal frequency $LO_2$ is variable over 45 KHz from 31.50 to 31.95 MHz. The upper and lower limits of the frequencies which are derived from the VFO output signal are correspondingly shown as the numerator and the nominator of fractions in the Table.

It will be appreciated that other frequency relationships may be used. For example, the input and output frequencies may be the same by selecting the fixed frequency oscillator output frequency $LO_1$ to be twice the input frequency. Then $$LO_1 = 2F_A \quad (11)$$

This relationship be derived from Equation (8) above as follows $$IF_3 = LO_1 - F_A \quad (12)$$

But $$IF_3 = F_A \text{ so } F_A = LO_1 - F_A \quad (13)$$

Therefore $$LO_1 = 2F_A \text{ for high side first LO injection} \quad (14)$$

Other frequency relationships and conversion may be used if desired. If the system is used in a transmitter the IF output becomes the input and the RF input becomes the output. The frequency relationships remain the same.

In the variable rejection bandwidth frequency conversion system shown in FIG. 2, a variable frequency oscillator 30a provides outputs to mixers 36a and 28a via a signal splitter 34a, so that the injections $I_1$, $I_2$ and $I_3$ may be derived in the same manner as in FIG. 1. A fixed frequency oscillator 32a, bandpass selecting filter 38a, and a frequency doubler 40a are used in a similar manner as explained in connection with FIG. 1 to provide these injection signals.

The RF input of frequency $F_A$ is converted to $IF_1$ by the mixer 16a and amplified by the amplifier 20a. This amplified signal is split by a signal splitter 42 into two branches 44 and 46 in the channel 10a. The branch 44 includes the filter 18a which determines the high frequency cutoff of the overall rejection or notch characteristic of the system. The mixer 22a converts the passband of the signal and presents it to the filter 24a. The filter 24a controls the low frequency cutoff of the overall rejection band or notch characteristics. The mixer 22a conversion proivdes the second IF, $IF_2$. The parallel branches are combined in a signal combiner 48. The signal combiner 48, like the signal splitter 42, may be transformer devices. The combined signals are applied to the mixer 28a where the signal from the filter 24a is up-converted and reversed in frequency, while the signal from the filter 18a is down-converted without frequency reversal. The results of the conversion in the mixer 28a with the injection $I_3$ of frequency $LO_2$ is the output frequency $IF_3$.

Again, the VFO frequency $LO_2$ does not affect the stability of the frequencies of the signals at the input and output ends of the channel 12a and 14a. The frequency of the output $IF_3$ is determined by the input frequency $F_A$ and the fixed frequency oscillator output signal frequency $LO_1$.

By inspection of FIG. 2 these frequency relationships may be derived. The notch width NW may be expressed as follows $$NW = \{[F_A - (LO_1 - LO_2)] - F_{C1}\} + \{2LO_2 - [F_A - (LO_1 - LO_2)] - F_{C2}\} \quad (15)$$

$$NW = 2LO_2 - F_{C1} - F_{C2} \quad (16)$$

The relationship of the output frequency $IF_3$ to the input frequency $F_A$ and the frequency $LO_1$ of the fixed frequency oscillator 32a can also be determined by inspection from FIG. 1 as follows $$IF_3 = [F_A - (LO_1 - LO_2)] - LO_2, \text{ also}$$
$$IF_3 = LO_2 - \{2LO_2 - [F_A - (F_A - (LO_1 - LO_2)]\} \quad (17)$$

$$IF_3 = F_A - LO_1, \text{ also } IF_3 = F_A - LO_1 \quad (18)$$

Referring to FIG. 3, a FM radio transmitter 50 is shown having a variable bandpass frequency conversion system consisting of a channel 52 similar to the channel 10 in FIG. 1, and injection sources 54 including a variable frequency oscillator such as the oscillator 30 and the other oscillators and mixers and other components 30, 34, 36, 38 and 40, as shown in FIG. 1. The sources provide the injections $I_1$, $I_2$ and $I_3$ as explained in connection with FIG. 1. The variable frequency oscillator may be electrically controlled by a control signal. The oscillator may have a voltage variable capacitor or other means for changing the frequency thereof. Such a control signal input is shown in FIGS. 1 and 2 as being applied to the VFO's 30 and 30a. It will be appreciated of course that the oscillator may be controlled manually or through servo control, or by means of an error signal or other control signal as required by the application.

In the transmitters, a VFO control signal is obtained from a discriminator 56 which follows the frequency of the FM signal at center frequency $IF_3$ which is applied to the end 14 of the channel 52. While the discriminator is shown as being connected to the signal applied to the end 14 of the channel, it may be derived from another point in the transmitter (e.g., from the audio section of the transmitter). The output of the discriminator 56 follows the modulating frequency and is proportional to the FM modulation index $m_f$. The bandwidth of the channel 52 and thus the transmission bandwidth of the FM signal which is outputted from the output end of the channel 12 amplified in a power amplifier 58 and transmitted by way of antenna 60 is limited to eliminate any unnecessary sidebands and minimize noise bandwidth of the FM signal. The FM signal which is transmitted thus has a higher signal to noise ratio than would be the case without the variable bandwidth feature provided by means of the system including the channel 52 and the injection sources 54 controlled by the discriminator 56.

Table B presents typical frequency values by way of illustration for the variable rejection or notch width system shown in FIG. 2. It will be observed that the notch width may vary approximately 5 KHz in the exemplary tabulation of frequencies shown in Table B.

From the foregoing description it will be apparent that there has been provided an improved system for signal processing. Variations, modifications in the hereindescribed system and other applications thereof will undoubtedly suggest themselves to those skilled in the art. For example, the variable rejection band system shown in FIG. 2 may be used in a FM or sideband transmitter to reduce the carrier frequency level by controlling the width of the rejection notch so as to affect the carrier frequency. The carrier frequency alone may be eliminated or the carrier frequency together with portions of the sideband adjacent thereto. The variable rejection or notch width system of FIG. 2 may be used to provide amplitude modulation as in an AM transmitter by centering the notch frequency on the carrier frequency to be transmitted and then varying the notch width by varying the frequency $LO_2$ of the VFO 30a at the desired modulation frequency. The sidebands formed are then outside of the rejection notch and not affected by the characteristics of the filters 20a and 24a. If for example, the modulating signal was a FM signal applied as a control signal to the VFO 30a, when a CW signal is applied to the RF input 12, the output frequency is amplitude modulated at a rate determined by the FM control signal which is applied to the VFO 30a.

Other variations and modifications within the scope of the invention will undoubtedly suggest themselves to those skilled in the art. Accordingly, the foregoing description should be taken as illustrative and not in a limiting sense.

I claim:

1. A system for variable bandwidth filtering of a signal having a passband while converting the frequency thereof between first and second frequencies of constant center frequency, said system comprising a channel for transmission of said signal and converting the frequency thereof between said first and second frequencies at opposite ends of said channel, first and second filter networks connected in said channel and having first and second cut-off frequencies respectively, said frequencies being selected from the low pass cut-off frequency of both said first and second filter networks and the high pass cut-off frequency of both said first and second filter networks, a plurality of means connected in said channel for converting the frequency of said signal and only said high pass cut-off frequency of both said filters or only said low pass cut-off frequency of both said filters are used, presenting the passband thereof in inverted frequency relationship (frequency spectrum reversed) to one and in direct frequency relationship to the other of said first and second filter networks and to the same selected one of said high pass and low pass cut-off frequencies of both of said networks, said converting means comprising three mixers in said channel, said filter networks each being connected between at least two of said three mixers, a single continuously variable frequency oscillator for providing an output signal the frequency of which determines said bandwidth, and means responsive to said variable oscillator output signal for applying injection signals to each of said mixers.

2. The invention as set forth in claim 1 wherein said frequency converting means further comprises a second oscillator providing a fixed frequency output signal, a fourth mixer to which said variable frequency oscillator and fixed frequency oscillator output signals are applied for providing a first injection frequency signal which is one of the upper and lower products of said oscillator output signals, to a first of said three channel mixers, said first mixer being disposed at the first frequency end of said channel.

3. The invention as set forth in claim 2 wherein said frequency converting means further comprises means responsive to said variable frequency oscillator output signals for providing a second injection frequency signal which is twice the frequency of said variable frequency oscillator output signal to a second of said three channel mixers which is connected between said first mixer and at least one of said first and second filter networks, the frequency of said variable frequency oscillator output signal being lower than the frequency of said second oscillator output signal and the frequency of said variable frequency oscillator signal and the frequency of said second oscillator output signal being of such frequencies that the lowest frequency of said first injection frequency signal is greater than the difference in frequency between said oscillator output signal frequencies, and means for providing said variable frequency oscillator output signal as a third injection frequency signal to a third of said channel mixers disposed at said second freqency end of said channel.

4. The invention as set forth in claim 3 wherein said system provides variable rejection band filtering and said channel has a first and a second branch which are in parallel with each other, said first filter network and said second mixer being connected in series in said first branch and said second filter network being connected in said second branch, and said branches being connected at one end thereof to said first mixer and at the opposite end thereof to said third mixer.

5. The invention as set forth in claim 3 wherein said system provides variable bandpass filtering and said first mixer, said first filter network, said second mixer, said second filter network and said third mixer are connected in series in said channel.

6. The invention as set forth in claim 1 wherein said first and second frequencies are RF and IF frequencies, respectively.

7. The invention as set forth in claim 6 wherein said system is adapted for use in a FM transmitter, said IF signal being a FM signal, means responsive to said IF signal for providing a control signal corresponding in magnitude to the modulating frequency of said FM signal, and means for applying said control signal to said variable frequency oscillator to control th bandwidth of said system inversely with said modulating frequency.

8. The invention as set forth in claim 7 wherein said control signal providing means includes circuit means for providing said conrol signal magnitude proportional to the modulation index of said IF signal.

* * * * *